(12) United States Patent
Jeon

(10) Patent No.: US 11,189,350 B2
(45) Date of Patent: Nov. 30, 2021

(54) CONTROLLER AND OPERATING METHOD THEREOF

(71) Applicant: SK hynix Inc., Gyeonggi-do (KR)

(72) Inventor: Myeong-Woon Jeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 22 days.

(21) Appl. No.: 16/221,896

(22) Filed: Dec. 17, 2018

(65) Prior Publication Data

US 2019/0303240 A1 Oct. 3, 2019

(30) Foreign Application Priority Data

Mar. 28, 2018 (KR) .................. 10-2018-0036121

(51) Int. Cl.
*G11C 16/26* (2006.01)
*G11C 29/52* (2006.01)
*G06F 11/10* (2006.01)

(52) U.S. Cl.
CPC .......... *G11C 16/26* (2013.01); *G06F 11/1068* (2013.01); *G11C 29/52* (2013.01)

(58) Field of Classification Search
CPC ...... G11C 16/26; G11C 29/52; G06F 11/1068
See application file for complete search history.

(56) References Cited

U.S. PATENT DOCUMENTS

| | | | |
|---|---|---|---|
| 9,368,225 B1 * | 6/2016 | Pinkovich | G11C 16/26 |
| 9,483,347 B2 | 11/2016 | Wu et al. | |
| 9,715,429 B1 * | 7/2017 | Lin | G06F 3/0619 |
| 10,915,388 B2 * | 2/2021 | Pao | G06F 11/1048 |
| 2009/0003058 A1 * | 1/2009 | Kang | G11C 11/5642 365/185.03 |
| 2010/0002506 A1 * | 1/2010 | Cho | G11C 11/5628 365/185.03 |
| 2011/0145663 A1 * | 6/2011 | Kong | G06F 11/1068 714/704 |
| 2011/0197015 A1 * | 8/2011 | Chae | G11C 11/5642 711/103 |
| 2011/0235415 A1 * | 9/2011 | Park | G11C 11/5642 365/185.09 |
| 2013/0329492 A1 * | 12/2013 | Yang | G11C 16/10 365/185.03 |

(Continued)

*Primary Examiner* — Steve N Nguyen
(74) *Attorney, Agent, or Firm* — IP & T Group LLP

(57) ABSTRACT

A controller includes a processor suitable for reading target data based on a predetermined main read voltage, and on each of a plurality of candidate read voltages having different voltage values; a memory suitable for storing main coded data and candidate coded data which are obtained by reading the target data; an ECC suitable for decoding the main coded data to generate main decoded data, and decoding each of the candidate coded data to generate candidate decoded data; and a counter suitable for counting the number of error bits corresponding to the main decoded data, and counting each of numbers of error bits corresponding to each of the candidate decoded data; and a voltage setting circuit suitable for setting a candidate read voltage having a minimum number of error bits, among the candidate decoded data, and which is smaller than the number of error bits corresponding to the main decoded data, as the main read voltage.

17 Claims, 12 Drawing Sheets

(56) References Cited

U.S. PATENT DOCUMENTS

| | | | |
|---|---|---|---|
| 2014/0043903 A1* | 2/2014 | Ok | G11C 16/26 365/185.03 |
| 2014/0153330 A1* | 6/2014 | Yoon | G11C 11/5642 365/185.03 |
| 2014/0355340 A1* | 12/2014 | Sharon | G11C 16/26 365/185.03 |
| 2015/0006983 A1* | 1/2015 | Lin | G11C 29/50004 714/721 |
| 2017/0097868 A1* | 4/2017 | Kim | G11C 16/34 |
| 2018/0246782 A1* | 8/2018 | Zeng | G11C 29/42 |
| 2018/0341553 A1* | 11/2018 | Koudele | G11C 29/52 |

* cited by examiner

CONTROLLER AND OPERATING METHOD THEREOF

CROSS-REFERENCE TO RELATED APPLICATIONS

The present application claims priority under 35 U.S.C. § 119(a) to Korean Patent Application No. 10-2018-0036121 filed on Mar. 28, 2018, the disclosure of which is incorporated herein by reference in its entirety.

BACKGROUND

1. Field

Various exemplary embodiments of the present invention relate generally to a controller for a semiconductor memory device. Particularly, exemplary embodiments relate to a controller for a semiconductor memory device capable of efficiently managing data, and an operating method thereof.

2. Description of the Related Art

The paradigm for computing environments continues to move rapidly into ubiquitous computing which allows people or users to use their individual or commonly supplied computing systems anytime anywhere.

Moreover, in this era of ubiquitous computing, the demand for portable electronic devices, such as mobile phones, digital cameras and laptop computers are soaring. Those electronic devices generally include a memory system which uses a semiconductor memory device (hereinafter referred to simply as memory device) as a data storage device for storing data. A memory system may be used as a main or an auxiliary data storage device for a portable electronic device.

Since memory devices do not use a mechanical driving component (e.g., a mechanical arm with a read/write head) as compared with a hard disk device, they generally exhibit excellent stability and durability, and fast data access rate at generally low power consumption. Non-limiting examples of memory devices having such advantages include Universal Serial Bus (USB) memory devices, memory cards of diverse interfaces, Solid-State Drives (SSD), and the like.

SUMMARY

Various embodiments of the present invention are directed to a controller for a semiconductor memory device that is capable of detecting efficiently an optimal read voltage.

In accordance with an embodiment of the present invention, a controller may include: a processor suitable for reading target data based on a predetermined main read voltage, and on each of a plurality of candidate read voltages having different voltage values; a memory suitable for storing main coded data and candidate coded data which are obtained by reading the target data; an ECC suitable for decoding the main coded data to generate main decoded data, and decoding each of the candidate coded data to generate candidate decoded data; and a counter suitable for counting the number of error bits corresponding to the main decoded data, and counting each of numbers of error bits corresponding to each of the candidate decoded data; and a voltage setting circuit suitable for setting a candidate read voltage having a minimum number of error bits, among the candidate decoded data, and which is smaller than the number of error bits corresponding to the main decoded data, as the main read voltage.

In accordance with an embodiment of the present invention, an operating method of controller may include: reading target data based on a predetermined main read voltage to store main coded data; decoding the main coded data to generate main decoded data; counting the number of error bits corresponding to the main decoded data; reading the target data based on each of a plurality of candidate read voltages having different voltage values from the predetermined main read voltage to store candidate coded data; decoding each of the candidate coded data to generate candidate decoded data; counting each of numbers of error bits corresponding to each of the candidate decoded data; and setting a candidate read voltage having a minimum number of error bits, among the candidate decoded data, which is smaller than the number of error bits corresponding to the main decoded data, as the main read voltage.

In accordance with an embodiment of the present invention, a memory system may include: a memory device including a plurality of memory cells for storing data; and a controller suitable for controlling the memory device, wherein the controller includes: a memory suitable for reading target data based on a predetermined main read voltage, and reading the target data based on each of a plurality of candidate read voltages having different voltage values from the predetermined main read voltage; a memory suitable for storing main coded data and candidate coded data which are obtained by reading the target data; an ECC suitable for decoding the main coded data to generate main decoded data, and decoding each of the candidate coded data to generate candidate decoded data; and a counter suitable for counting the number of error bits corresponding to the main decoded data, and counting each of numbers of error bits corresponding to each of the candidate decoded data; and a voltage setting circuit suitable for setting a candidate read voltage having a minimum number of error bits, among the candidate decoded data, which is smaller than the number of error bits corresponding to the main decoded data, as the main read voltage.

BRIEF DESCRIPTION OF THE DRAWINGS

These and other features and advantages of the present invention will become apparent to those skilled in the art of the invention from the following detailed description in conjunction with the accompanying drawings wherein like reference numerals refer to like parts throughout the several views.

DETAILED DESCRIPTION

Figure 1:
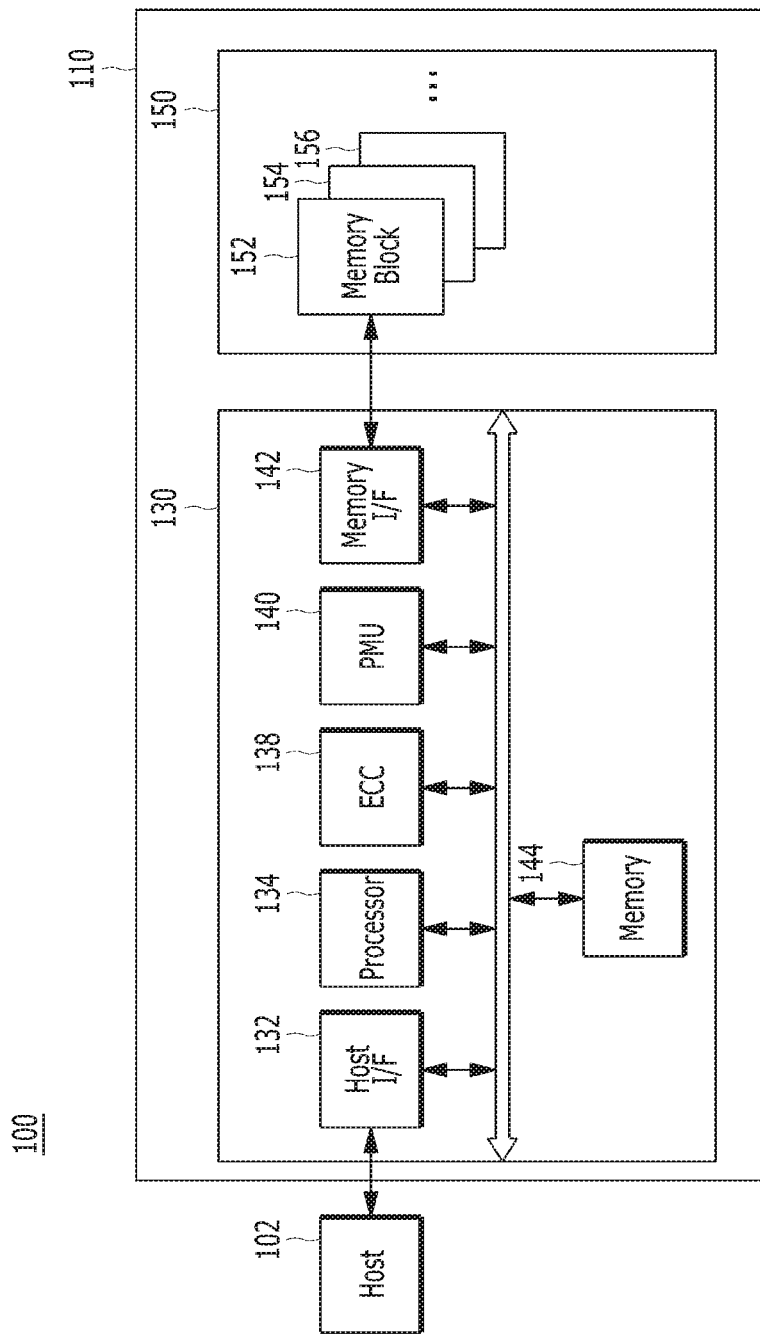
FIG. 1 is a block diagram illustrating a data processing system including a memory system and a host operatively coupled to each other, in accordance with an embodiment of the present invention.

Various embodiments of the disclosure of the present invention are described below in more detail with reference to the accompanying drawings. It is noted, however, that the invention may be embodied in different other embodiments, forms and variations thereof and should not be construed as being limited to the embodiments set forth herein. Rather, the described embodiments are provided so that this disclosure will be thorough and complete, and will fully convey the disclosure to those skilled in the art to which this invention pertains. Throughout the disclosure, like reference numerals refer to like parts throughout the various figures and examples of the disclosure.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100, in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a TV, a projector and the like.

The memory system 110 may operate or perform a specific function or operation in response to a request from the host 102. For example, the memory system 110 may store data in response to a request from the host 102. The stored data may be accessed by the host 102 in response to another request from the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM) and a flash memory.

The memory system 110 may include a memory device 150 which stores data to be accessed by the host 102, and a controller 130 which may control storage of data in the memory device 150.

The controller 130 and the memory device 150 may be integrated into a single semiconductor device, which may be included in the various types of memory systems as exemplified above.

The memory system 110 may be configured as a part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the plurality of pages may include a plurality of memory cells to which a plurality of word lines (WL) are electrically coupled.

The controller 130 may control overall operations of the memory device 150, such as read, write, program and erase operations. The controller 130 of the memory system 110 may control the memory device 150 in response to a request from the host 102. The controller 130 may provide the data, read from the memory device 150, to the host 102, and/or may store the data, provided by the host 102, into the memory device 150.

The controller 130 may include a host interface (I/F) 132, a processor 134, an error correction code (ECC) 138, a power management unit (PMU) 140, a memory device controller such as a memory interface (I/F) 142 and a memory 144 all operatively coupled via an internal bus. The memory interface (I/F) 142 and the memory 144 may serve as a memory device controller.

The host interface 132 may process commands and data provided from the host 102, and may communicate with the host 102 through at least one of various interface protocols such as universal serial bus (USB), multimedia card (MMC), peripheral component interconnect-express (PCI-E), small computer system interface (SCSI), serial-attached SCSI (SAS), serial advanced technology attachment (SATA), parallel advanced technology attachment (DATA), small computer system interface (SCSI), enhanced small disk interface (ESDI) and integrated drive electronics (IDE).

The ECC 138 may detect and correct errors in the data read from the memory device 150 during the read operation. When the number of the error bits is greater than or equal to a threshold number of correctable error bits, the ECC 138 may not correct error bits but may output an error correction fail signal indicating failure in correcting the error bits.

The ECC 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC 138 may include all or some of circuits, modules, systems or devices for performing the error correction operation based on at least one of the above described codes.

The PMU 140 may provide and manage power of the controller 130.

The memory interface 142 may serve as an interface for handling commands and data transferred between the controller 130 and the memory device 150, so as to allow the controller 130 to control the memory device 150 in response to a request delivered from the host 102. The memory interface 142 may generate a control signal for the memory device 150 and may process data entered into or outputted from the memory device 150 under the control of the processor 134, in a case when the memory device 150 is a flash memory and, in particular, when the memory device 150 is a NAND flash memory.

The memory 144 may serve as a working memory of the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory.

The memory 144 may be implemented with a static random access memory (SRAM) or a dynamic random access memory (DRAM). Although FIG. 1 exemplifies the memory 144 disposed within the controller 130, the disclosure is not limited thereto. That is, the memory 144 may be located inside or outside the controller 130. For instance, the memory 144 may be embodied by an external volatile memory having a memory interface transferring data and/or signals transferred between the memory 144 and the controller 130.

The processor 134 may control the overall operations of the memory system 110. The processor 134 may drive or execute a firmware to control the overall operations of the memory system 110. The firmware may be referred to as a flash translation layer (FTL).

The FTL may perform an operation as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data on another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134. The management unit may perform bad block management of the memory device 150. The management unit may find bad memory blocks included in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 100, and thus reliable bad block management is required.

Figure 2:
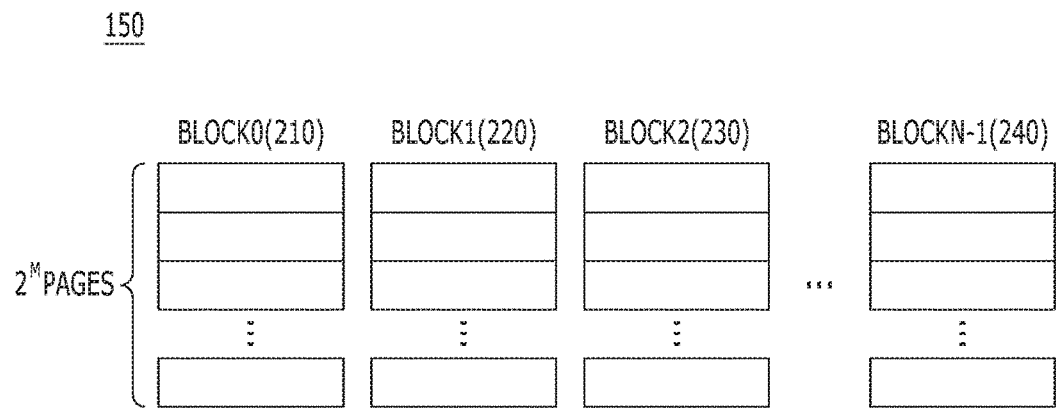
FIG. 2 is a schematic diagram illustrating an exemplary configuration of a memory device of the memory system shown in FIG. 1.

FIG. 2 is a schematic diagram illustrating the memory device 150.

Referring to FIG. 2, the memory device 150 may include the plurality of memory blocks BLOCK 0 to BLOCKN−1, and each of the blocks BLOCK 0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
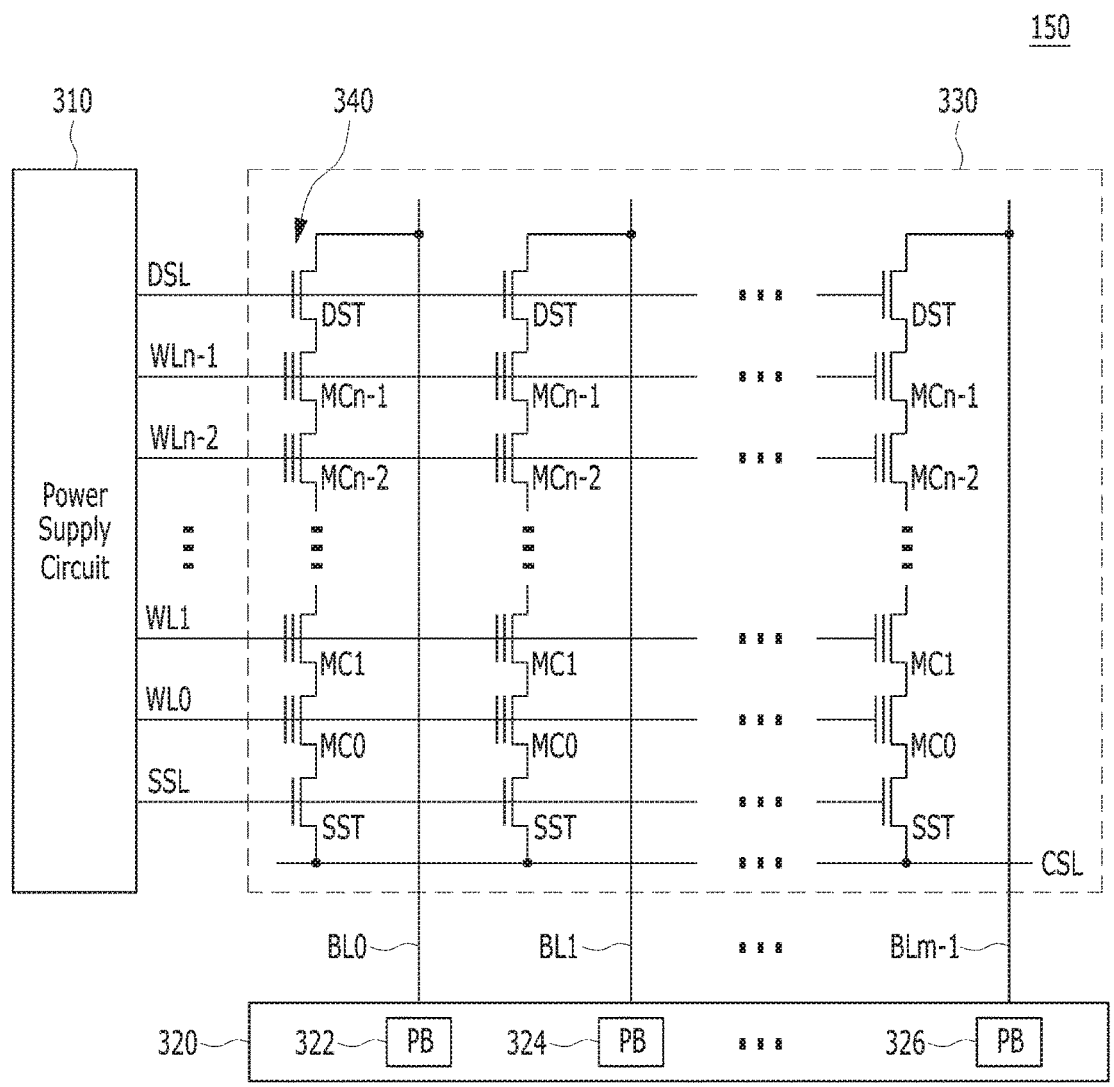
FIG. 3 is a circuit diagram illustrating an exemplary configuration of a memory cell array of a memory block in the memory device shown in FIG. 2.

FIG. 3 is a circuit diagram illustrating a memory block 330 in the memory device 150.

Referring to FIG. 3, the memory block 330 may correspond to any of the plurality of memory blocks 152 to 156.

Referring to FIG. 3, the memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 only shows, as an example, that the memory block 330 is constituted with NAND flash memory cells, it is to be noted that the memory block 330 of the memory device 150 according to the embodiment is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
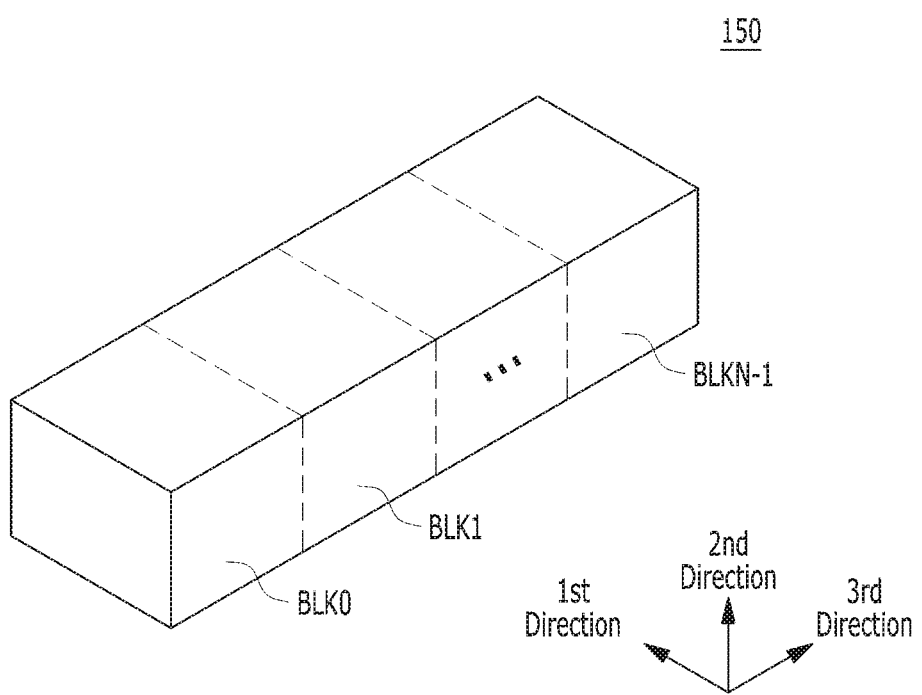
FIG. 4 is a schematic diagram illustrating an exemplary three-dimensional structure of the memory device shown in FIG. 2.

FIG. 4 is a schematic diagram illustrating a 3D structure of the memory device 150.

Referring to FIG. 4, the memory device 150 may be embodied in a nonvolatile memory device having a 3D stack structure. The memory device 150 may include a plurality of memory blocks BLK0 to BLKN−1 each having a 3D structure (or a vertical structure).

Figure 5:
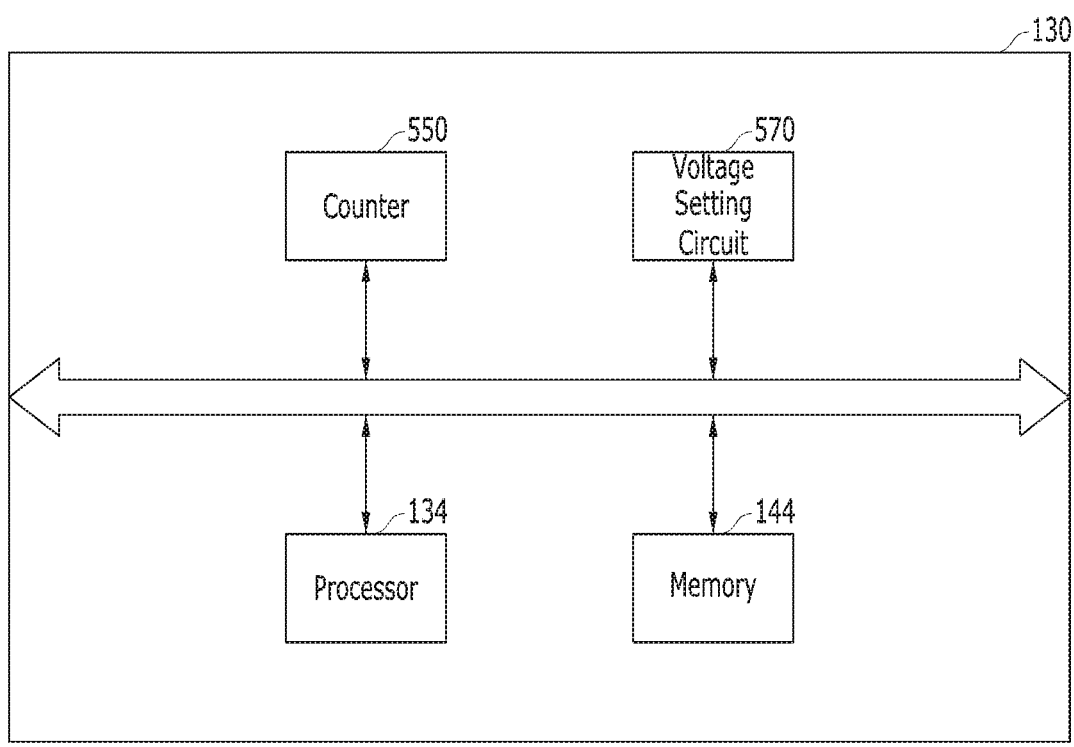
FIG. 5 is a block diagram illustrating a structure of the memory controller, in accordance with an embodiment of the present invention.

FIG. 5 is a diagram schematically illustrating a structure of the controller 130, in accordance with an embodiment of the present invention.

The controller 130 may further include a counter 550 and a voltage setting circuit 570 in addition to the ECC 138, the memory 144 and the processor 134 described above with reference to FIG. 1. The controller 130 may efficiently perform a read operation on successive data.

The controller 130 may control the memory device 150 to read target data corresponding to a request of the host 102 based on a predetermined main read voltage. Specifically, the processor 134 may control the memory device 150 to read the target data based on the main read voltage and may store main coded data in the memory 144. The ECC 138 may perform a decoding operation on the main coded data stored in the memory 144 to generate main decoded data. The counter 550 may count the number of error bits corresponding to the main decoded data. When the number of error bits of the counted main decoded data is smaller than a predetermined threshold value, the controller 130 may finally output the main decoded data to the host 102.

In this manner, the read operation may be successively performed on the target data based on the predetermined main read voltage. However, the predetermined main read voltage may not be an optimal read voltage capable of reading the target data. Hereinafter, a method is described in which the controller 130 searches for a read voltage that is more optimized than the main read voltage after the read operation is successively performed on the target data based on the predetermined main read voltage. For convenience in description, it is assumed that all of the data read based on the predetermined main read voltage and candidate read voltages satisfy a predetermined decoding condition. In other words, it is assumed that the read operation may be successively performed although the target data is read based on the main read voltage and each of the candidate read voltages.

The processor 134 may read the target data based on a plurality of candidate read voltages. The candidate read voltages may be different from the main read voltage. The processor 134 may store candidate coded data obtained by reading the target data in the memory 144. The ECC 138 may perform a decoding operation on each of the candidate coded data to generate candidate decoded data corresponding to each of the candidate coded data.

The counter 550 may count the number of error bits and non-error bits of data using the decoded data and the coded data. The number of error bits may be calculated based on a difference between the decoded data and the coded data. For example, since errors occur in a third bit and a seventh bit when the coded data is '01010011' and the decoded data is '01110001', the counter 550 may count two error bits.

Additionally, the counter 550 may calculate the number of error bits of each of the candidate decoded data that are read based on the plurality of candidate read voltages. For example, the counter 550 may calculate a first number of error bits of first coded data read based on a first candidate read voltage, and calculate a second number of error bits of second coded data read based on a second candidate read voltage.

Further, the counter 550 may compare the first number of error bits with the second number of error bits. When the second number of error bits is smaller than the first number of error bits, the second candidate read voltage may be determined to be more optimal than the first candidate read voltage.

In the same manner, the counter 550 may compare the number of error bits of the main decoded data which are read based on the main read voltage with the number of error bits of the candidate decoded data which are read based on each of the plurality of candidate read voltages.

The voltage setting circuit 570 may set a candidate read voltage corresponding to the candidate decoded data having the least number of error bits among the candidate decoded data, and which is smaller than the number of error bits of the main decoded data as the main read voltage. For example, when the number of error bits of the main decoded data is '20', the number of error bits of the first candidate decoded data is '18' and the number of error bits of the second candidate decoded data is '15', the voltage setting circuit 570 may reset the second candidate read voltage which corresponds to the second candidate decoded data to become the main read voltage.

When there is no candidate decoded data which has less error bits than the main decoded data, the voltage setting circuit 570 may maintain the predetermined main read voltage.

The processor 134 may control the memory device 150 to read the target data based on the main read voltage which is set by the voltage setting circuit 570. When the main read voltage is changed, i.e., when the voltage setting circuit 570 resets the main read voltage then the processor 134 may control the memory device 150 to read the target data based on the changed main read voltage.

Additionally, the processor 134 may control the memory device 150 to perform a reclaim operation based on the number of error bits of the data read which are detected based on the main read voltage. For example, if we assume that the number of error bits that triggers the reclaim operation is set at '60', when the number of error bits of the data read based on the first read voltage is '80', the reclaim operation may be triggered. However, in the same example, when the number of error bits of the data read based on the second read voltage is '40', the reclaim operation may not be triggered. In other words, the performing frequency of the reclaim operation can be reduced by changing the main read voltage to a more optimal read voltage which improves the read performance of the controller 130.

Figure 6:
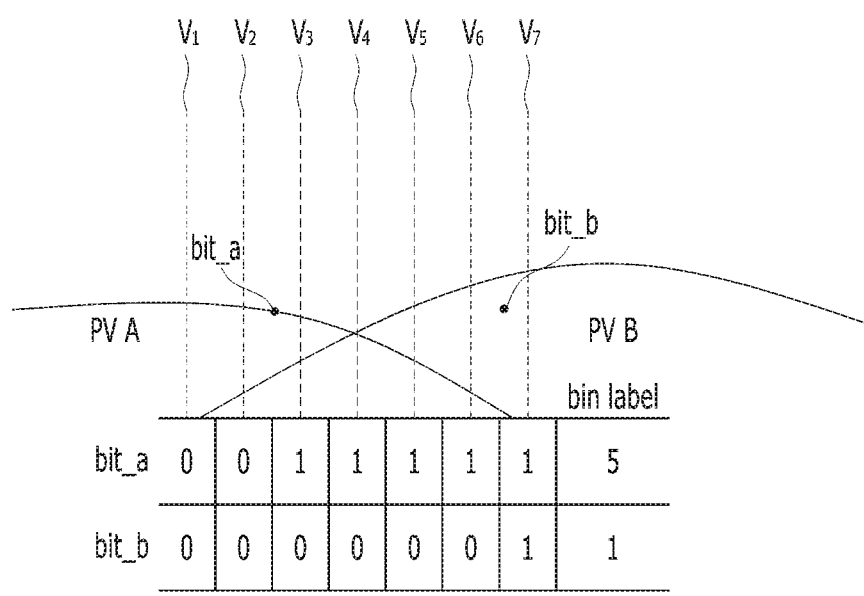
FIG. 6 is a diagram illustrating a method of calculating a bin label in accordance with an embodiment of the present invention.

FIG. 6 is a diagram illustrating a method of calculating a bin label in accordance with an embodiment of the present invention. The controller 130 may repeatedly perform the read operation according to the request of the host 102, thereby figuring out a distribution of the threshold voltage for each memory cell of the memory device 150. In addition, the controller 130 may store location information of a threshold voltage of each memory cell as bin label data in the memory 144 based on the distribution of the threshold voltage. In other words, the bin label data may include information of the threshold voltage for each memory cell of the memory device 150, which is divided by the plurality of read voltages.

The bin label, which is a means of dividing locations of bits, may be divided into total eight locations as shown in FIG. 6. The counter 550 may calculate the number of error bits and non-error bits of each decoded data for each bin label.

For convenience in description, it is assumed that "PV_A" is the distribution of the threshold voltage of a memory cell group A, and "PV_B" is the distribution of the threshold voltage of a memory cell group B. Further, it is assumed that there are seven candidate read voltages, i.e., first candidate read voltage $V_1$ to seventh candidate read voltage $V_7$. When a location of a specific bit has a higher threshold voltage than a corresponding read voltage, a value of the specific bit may be calculated as '0', and when the location of the specific bit has a lower threshold voltage than the corresponding read voltage, the threshold voltage of the specific bit may be calculated as '1'. Further, the threshold voltages of the bit may be sequentially calculated based on the first candidate read voltage $V_1$ to the seventh candidate read voltage $V_7$ so that respective digits may be listed. The listed digits refer to the bin label data, and a value obtained by adding up all the bin label data is the bin label.

For example, a bit may have a threshold voltage between the second candidate read voltage $V_2$ and the third candidate read voltage $V_3$. Since the threshold voltage of the bit bit_a is higher than the first candidate read voltage $V_1$, the threshold voltage may be calculated as '0' based on the first candidate read voltage $V_1$. Since the threshold voltage of the bit bit_a is higher than the second candidate read voltage $V_2$, the threshold voltage may be calculated as '0' based on the second candidate read voltage $V_2$. Since the threshold voltages of the bit are lower than the third candidate read voltage $V_3$ to the seventh candidate read voltage the threshold voltages may be calculated as '1' based on the third candidate read voltage $V_3$ to the seventh candidate read voltage $V_7$. That is, the bin label data of the bit bit_a may be '0011111', and the bin label is '5'.

In the same manner, a bit bit_b may have a threshold voltage between the sixth candidate read voltage $V_6$ and the seventh candidate read voltage $V_7$. Since the threshold voltages of the bit are higher than the first candidate read voltage $V_1$ to sixth candidate read voltage $V_6$, the threshold voltages may be calculated as '0' based on the first candidate read voltage $V_1$ to sixth candidate read voltage $V_6$. Since the threshold voltage of the bit bit_b is lower than the seventh candidate read voltage $V_7$, the threshold voltage may be calculated as '1' based on the seventh candidate read voltage $V_7$. That is, the bin label data of the bit bit_b may be '0000001', and the bin label is '1'.

When the threshold voltage of a specific bit is lower than the first candidate read voltage $V_1$, the bin label of the bit is '7'. When the threshold voltage of the bit is higher than the seventh candidate read voltage $V_7$, the bin label of the bit is '0'. Accordingly, the bin label may have eight values from '0' to '7'.

Figure 7A:
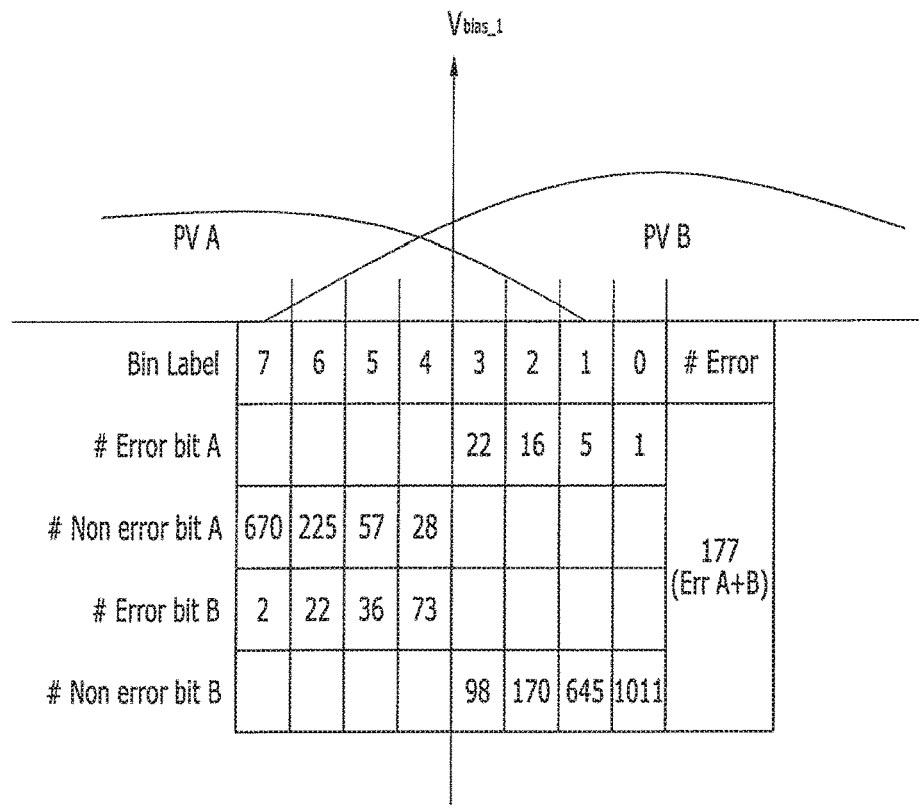
FIGS. 7A and 7B are diagrams illustrating an operation of the controller, according to embodiments of the present invention.

FIG. 7A is a diagram illustrating an operation of the controller 130 in accordance with an embodiment of the present invention.

The processor 134 may control the memory device 150 to read the target data. Specifically, the processor 134 may control to read the memory device 150 based on a predetermined main read voltage $V_{bias\_1}$ to read the target data. As described above, the counter 550 may calculate the number of error bits and non-error bits of the main decoded data for each bin label based on the main read voltage $V_{bias\_1}$.

When the controller 130 controls the memory device 150 to read the target data according to the distribution of the threshold voltage of the memory cell group A PV_A based on the main read voltage $V_{bias\_1}$, bits included in third to zeroth bin labels are the error bits. Specifically, the number of error bits of the main decoded data corresponding to the target data is '44' obtained by adding up '22' generated from the third bin label, '16' generated from the second bin label, '5' generated from the first bin label and '1' generated from the zeroth bin label. When the controller 130 controls the memory device 150 to read the target data according to the distribution of the threshold voltage of the memory cell group A PV_A based on the main read voltage bits included in seventh to fourth bin labels are the non-error bits. Specifically, the number of non-error bits of the main decoded data corresponding to the target data are '28' generated from the fourth bin label, '57' generated from the fifth bin label, '225' generated from the sixth bin label and '670' generated from the seventh bin label.

In the same manner, when the controller 130 controls the memory device 150 to read the target data according to the distribution of the threshold voltage of the memory cell group B PV_B based on the main read voltage $V_{bias\_1}$, bits included in the seventh to fourth bin labels are the error bits. Specifically, the number of error bits of the main decoded data corresponding to the target data is '133' obtained by adding up '2' generated from the seventh bin label, '22' generated from the sixth bin label, '36' generated from the fifth bin label and '73' generated from the fourth bin label. When the controller 130 controls the memory device 150 to read the target data according to the distribution of the threshold voltage of the memory cell group B PV_B based on the main read voltage $V_{bias\_1}$, bits included in the third to zeroth bin labels are the non-error bits. Specifically, the numbers of non-error bits of the main decoded data corresponding to the target data are '98' generated from the third bin label, '170' generated from the second bin label, '645' generated from the first bin label and '1011' generated from the zeroth bin label.

Accordingly, the total number of error bits read based on the main read voltage $V_{bias\_1}$ is '177'.

Figure 7B:
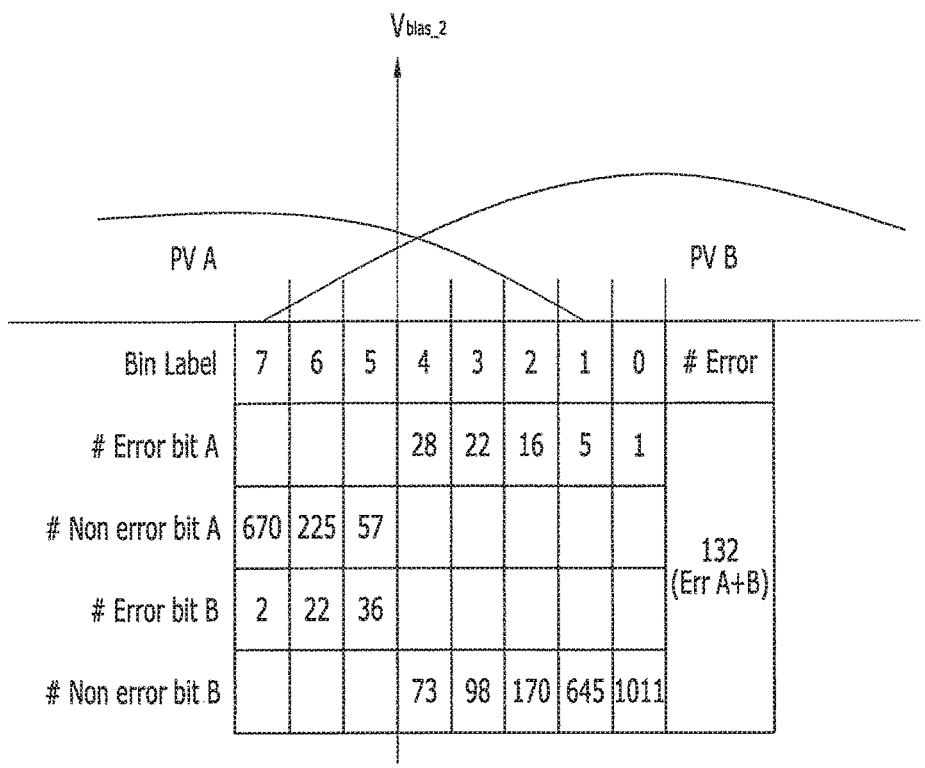

FIG. 7B is a diagram illustrating an operation of the controller 130 in accordance with an embodiment of the present invention.

When the controller 130 controls the memory device 150 to read the target data according to the distribution of the threshold voltage of the memory cell group A PV_A based on a candidate read voltage $V_{bias\_2}$, bits included in fourth to zeroth bin labels are the error bits. Specifically, the number of error bits of the candidate decoded data corresponding to the target data is '72' obtained by adding up '28' generated from the fourth bin label, '22' generated from the third bin label, '16' generated from the second bin label, '5' generated from the first bin label and '1' generated from the zeroth bin label. When the controller 130 controls the memory device 150 to read the target data according to the distribution of the threshold voltage of the memory cell group A PV_A based on the candidate read voltage $V_{bias\_2}$, bits included in seventh to fifth bin labels are the non-error bits. Specifically, the numbers of non-error bits of the candidate decoded data corresponding to the target data are '57' generated from the fifth bin label, '225' generated from the sixth bin label and '670' generated from the seventh bin label.

In the same manner, when the controller 130 controls the memory device 150 to read the target data according to the distribution of the threshold voltage of the memory cell group B PV_B based on the candidate read voltage $V_{bias\_2}$, bits included in the seventh to fifth bin labels are the error bits. Specifically, the number of error bits of the candidate decoded data corresponding to the target data is '60' obtained by adding up '2' generated from the seventh bin label, '22' generated from the sixth bin label and '36' generated from the fifth bin label. When the controller 130 controls the memory device 150 to read the target data according to the distribution of the threshold voltage of the memory cell group B PV_B based on the candidate read voltage $V_{bias\_2}$, bits included in the fourth to zeroth bin labels are the non-error bits. Specifically, the numbers of non-error bits of the candidate decoded data corresponding to the target data are '73' generated from the fourth bin label, '98' generated from the third bin label, '170' generated from the second bin label, '645' generated from the first bin label and '1011' generated from the zeroth bin label.

Accordingly, the total number of error bits read based on the candidate read voltage $V_{bias\_2}$ is '132'.

The counter 550 may compare the number of error bits read based on the candidate read voltage $V_{bias\_2}$ with the number of error bits read based on the main read voltage $V_{bias\_1}$.

When the processor 134 controls the memory device 150 to read the target data based on the main read voltage $V_{bias\_1}$, the voltage setting circuit 570 may set the candidate read voltage $V_{bias\_2}$ that is more optimized, as the main read voltage after the read operation for the target data is completed. In addition, the processor 134 may control the memory device 150 to read the target data based on the newly set main read voltage $V_{bias\_2}$.

Figure 8:
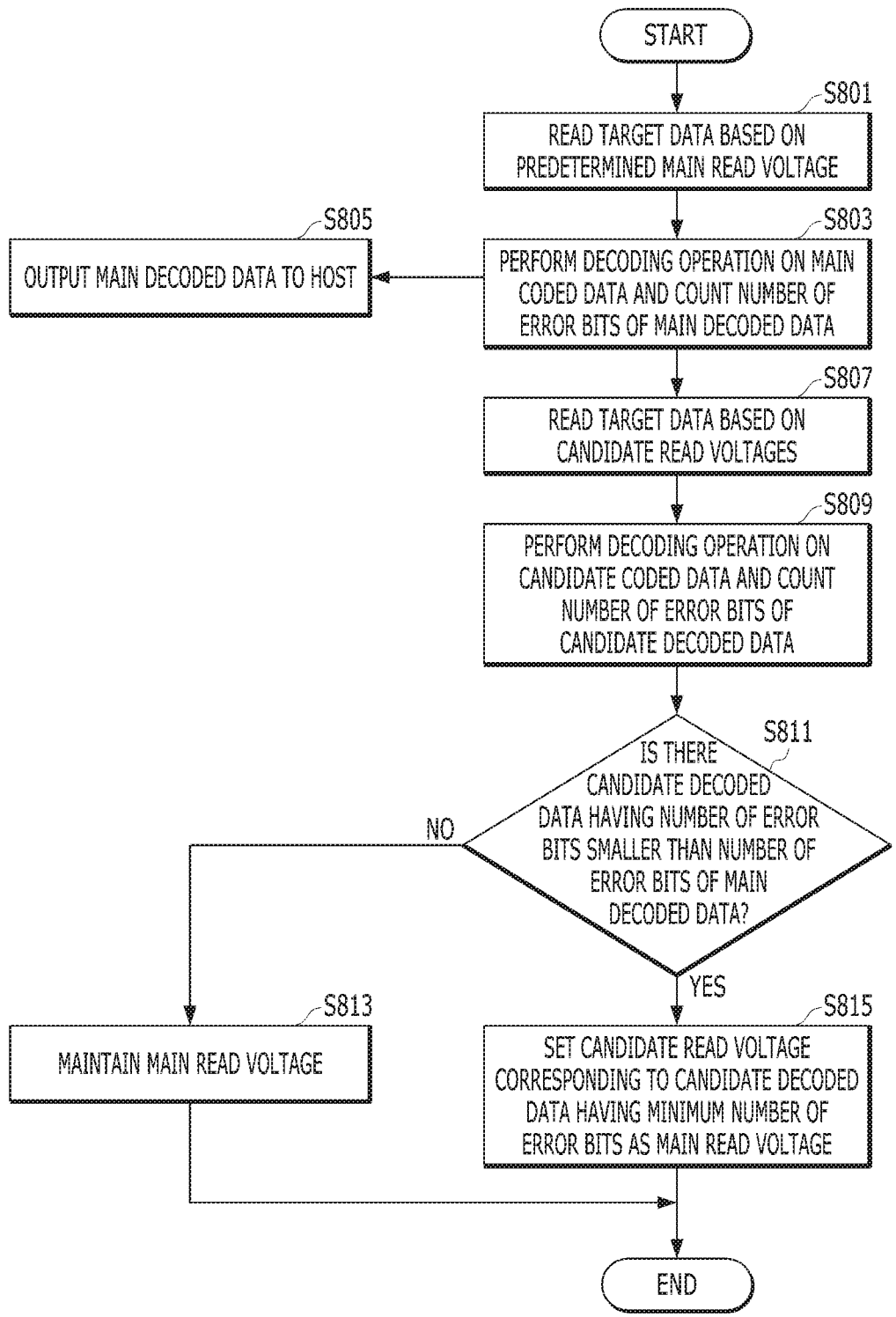
FIG. 8 is a flowchart illustrating an operation of the memory device in accordance with an embodiment of the present invention.

FIG. 8 is a flowchart illustrating an operation of the controller 130 in accordance with an embodiment of the present invention. For convenience in description, it is assumed that all the data read based on the main read voltage and the candidate read voltage satisfy predetermined decoding conditions.

In step S801, the processor 134 may read target data based on a predetermined main read voltage.

In step S803, the ECC 138 may perform the decoding operation on main coded data corresponding to the target data read by the processor 134 in step S801 to generate main decoded data. The counter 550 may count the number of error bits of the main decoded data as described above with reference to FIGS. 5 to 7.

In step S805, the controller 550 may output the main decoded data to the host 102.

In step S807, apart from the operation of outputting the main decoded data to the host 102, the processor 134 may read the target data based on a plurality of candidate read voltages.

In step S809, the ECC 138 may perform the decoding operation on candidate coded data corresponding to the target data read by the processor 134 in step S807 to generate candidate decoded data. The counter 550 may count the number of error bits of the candidate decoded data as described above with reference to FIGS. 5 to 7.

In step S811, the counter 550 may compare the number of error bits of the main decoded data with the number of error bits of the candidate decoded data.

When there is no candidate decoded data having the number of error bits which is smaller than the number of error bits of the main decoded data (that is, "NO" in step S811), the voltage setting circuit 570 may maintain the main read voltage in step S813. The processor 134 may read data corresponding to a request of the host 102 based on the main read voltage.

When there is candidate decoded data having fewer the number of error bits which is smaller than the number of error bits of the main decoded data (that is, "YES" in step S811), the voltage setting circuit 570 may set a candidate read voltage corresponding to candidate decoded data having a minimum number of error bits among the candidate decoded data, which is smaller than the number of error bits of the main decoded data, as the main read voltage in step S815. The processor 134 may read the data corresponding to the request of the host 102 based on the newly set main read voltage.

As described above, in accordance with the embodiments of the present invention, a reference read voltage may be adjusted to be optimized, and the controller 130 may efficiently perform the reclaim operation and maximize the read performance based on the optimized reference read voltage.

Hereinafter, a data processing system and electronic devices which may be constituted with the memory system 110 including the memory device 150 and the controller 130, which are described above by referring to FIGS. 1 to 8, will be described in detail with reference to FIGS. 9 to 17.

FIGS. 9 to 17 are diagrams schematically illustrating application examples employing the system of FIGS. 1 to 8 according to various embodiments of the present invention.

Figure 9:
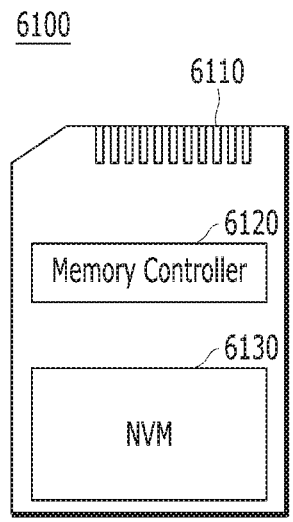
FIGS. 9 to 17 are diagrams schematically illustrating application examples of a data processing system, in accordance with various embodiments of the present invention.

FIG. 9 is a diagram schematically illustrating the data processing system including the memory system in accordance with an embodiment of the present invention. FIG. 9 schematically illustrates a memory card system including the memory system.

Referring to FIG. 9, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory. By the way of example but not limitation, the memory controller 6120 may be configured to control read, write, erase and background operations onto the memory device 6130. The memory controller 6120 may be configured to provide an interface between the memory device 6130 and a host and/or a drive firmware for controlling the memory device 6130. That is, the memory controller 6120 may correspond to the controller 130 in the memory system 110 described with reference to FIGS. 1 to 8, while the memory device 6130 may correspond to the memory device 150 described with reference to FIGS. 1 to 8.

Thus, the memory controller 6120 may include a RAM, a processor, a host interface, a memory interface and an error correction code (ECC). The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 10:
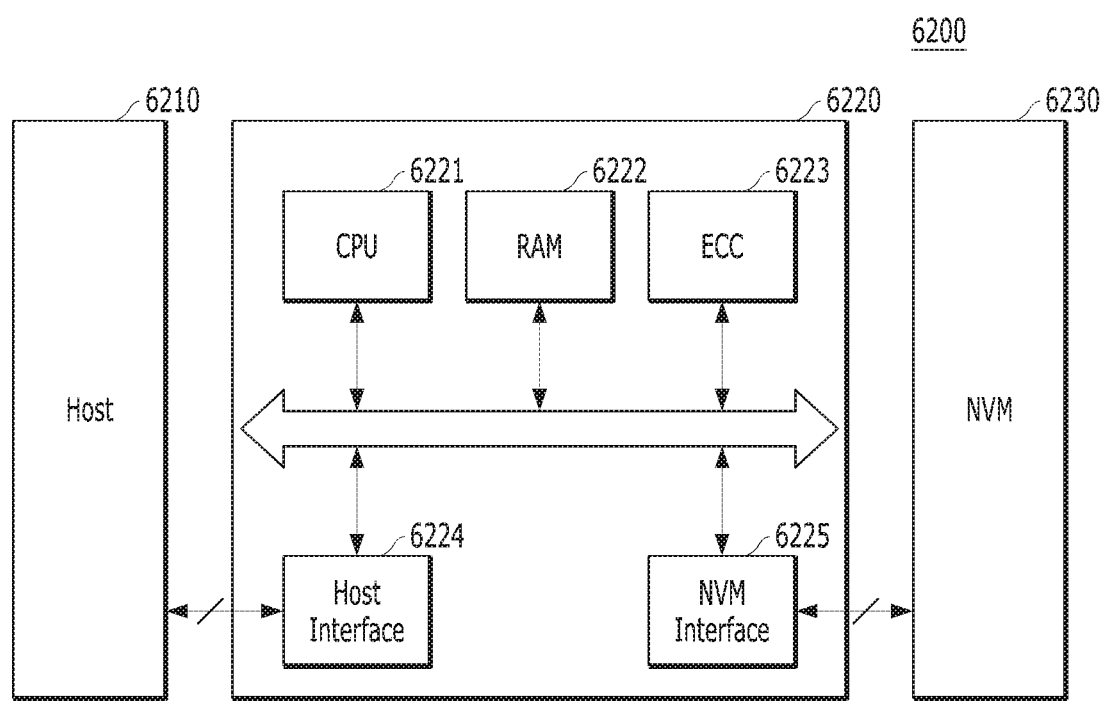

FIG. 10 is a diagram schematically illustrating another example of the data processing system including a memory system, in accordance with an embodiment.

Referring to FIG. 10, the data processing system 6200 may include a memory device 6230 having one or more nonvolatile memories and a memory controller 6220 for controlling the memory device 6230. The data processing system 6200 illustrated in FIG. 10 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 8, and the memory controller 6220 may correspond to the controller 130 in the memory system 110 described in FIGS. 1 to 8.

The memory controller 6220 may control a read, write, or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control the operations on the memory device 6230, for example, read, write, file system management and bad page management operations. The RAM 6222 may be operated under the control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. In this case, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit to, or receive from, the host 6210 data or signals through the host interface 6224, and may transmit to, or receive from, the memory device 6230 data or signals through the NVM interface 6225. The host interface 6224 may be connected to the host 6210 through a PATA bus, a SATA bus, a SCSI, an USB, a PCIe, or a NAND interface. The memory controller 6220 may have a wireless communication function with a mobile communication protocol such as WiFi or Long Term Evolution (LTE). The memory controller 6220 may be connected to an external device, e.g., the host 6210, or another external device, and then transmit/receive data to/from the external device. As the memory controller 6220 is configured to communicate with the external device through one or more of various communication protocols, the memory system and the data processing system in accordance with an embodiment may be applied to wired/wireless electronic devices or particularly a mobile electronic device.

Figure 11:
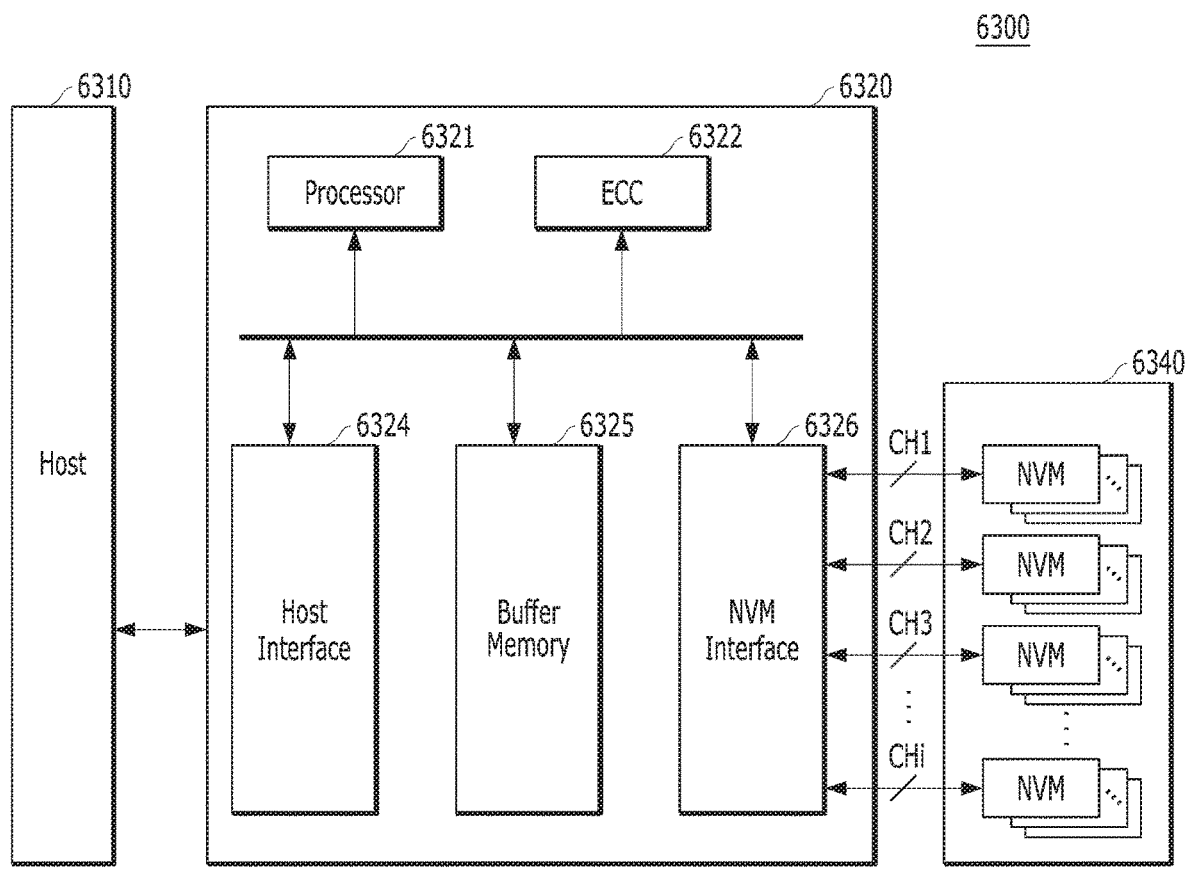

FIG. 11 is a diagram schematically illustrating another example of the data processing system including the memory system in accordance with an embodiment. FIG. 11 schematically illustrates an SSD to which the memory system in accordance with an embodiment is applied.

Referring to FIG. 11, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a DRAM, an SDRAM, a DDR SDRAM, an LPDDR SDRAM and a GRAM or nonvolatile memories such as an FRAM, a ReRAM, a STT-MRAM and a PRAM. For the purpose of description, FIG. 11 illustrates that the buffer memory 6325 exists in the controller 6320, but the buffer memory 6325 may be located or arranged outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read operation in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
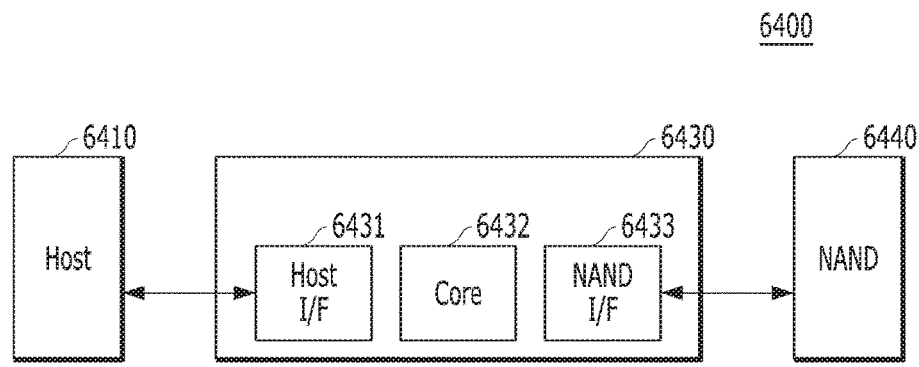
Figure 13:
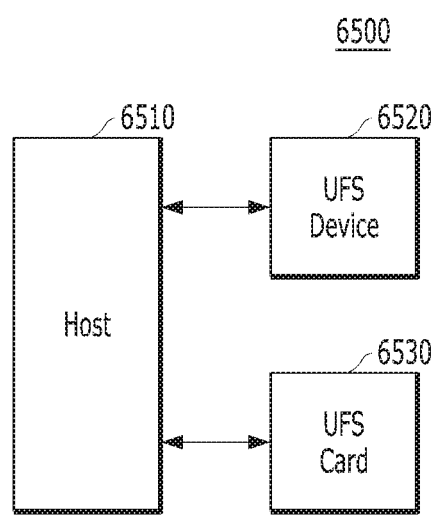
Figure 14:
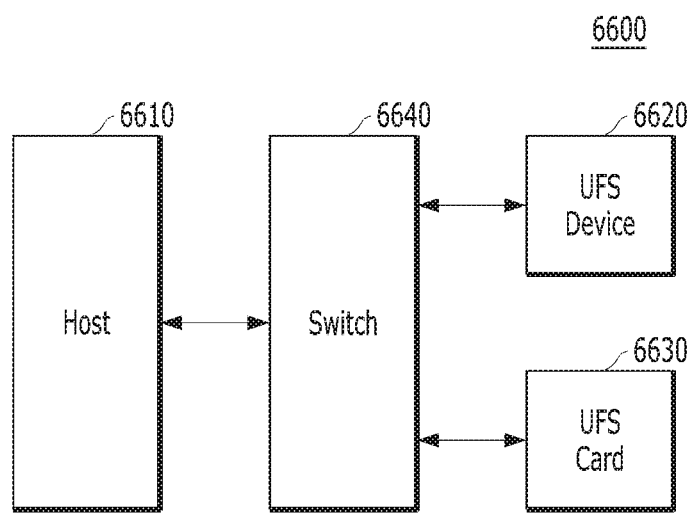
Figure 15:
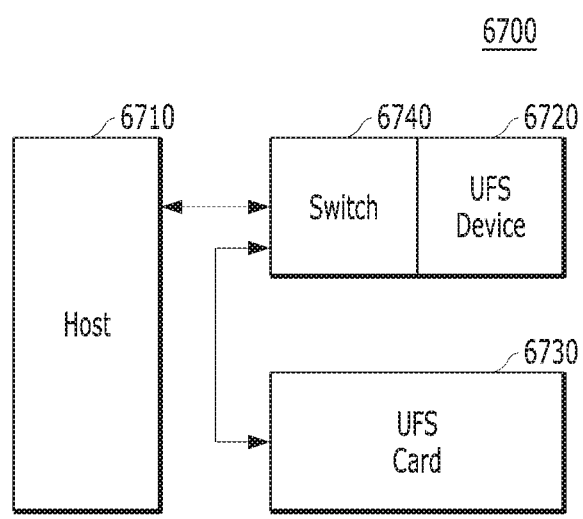
Figure 16:
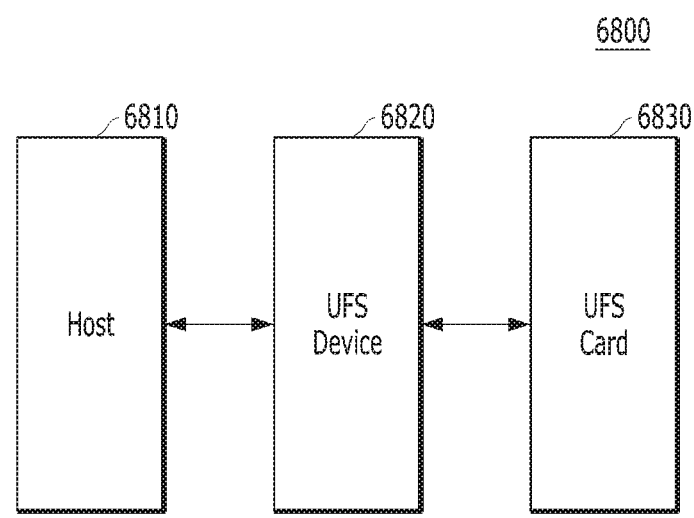

FIG. 12 is a diagram schematically illustrating another example of the data processing system including the memory system in accordance with an embodiment. FIG. 12 schematically illustrates an embedded Multi-Media Card (eMMC) to which the memory system in accordance with an embodiment is applied.

Referring to FIG. 12, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels.

The controller 6430 may include one or more cores 6432, a host interface 6431 and a memory interface, for example, a NAND interface 6433.

The core 6432 may control the operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 13 to 16 are diagrams schematically illustrating other examples of the data processing system including the memory system in accordance with an embodiment. FIGS. 13 to 16 schematically illustrate UFS (Universal Flash Storage) systems to which the memory system in accordance with an embodiment is applied.

Referring to FIGS. 13 to 16, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 10 to 12, and the UFS cards 6530, 6630, 6730, 6830 may be embodied in the form of the memory card system 6100 described with reference to FIG. 9.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., UFDs, MMC, SD, mini-SD, and micro-SD.

Figure 17:
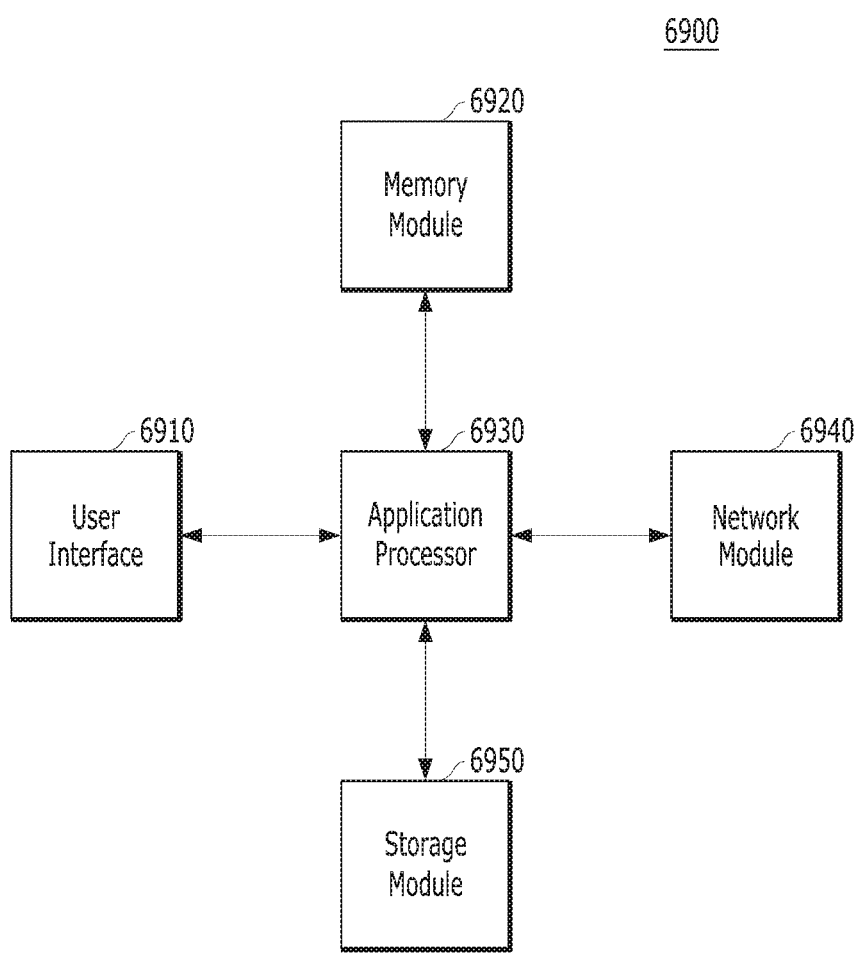

FIG. 17 is a diagram schematically illustrating another example of the data processing system including the memory system in accordance with an embodiment. FIG. 17 is a diagram schematically illustrating a user system to which the memory system in accordance with an embodiment is applied.

Referring to FIG. 17, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as determined in the following claims.

What is claimed is:

1. A controller, comprising:
a processor suitable for repeatedly reading target data based on a main read voltage and a plurality of candidate read voltages having different levels to obtain main coded data and candidate coded data;
a memory suitable for storing the main coded data corresponding to the main read voltage and the candidate coded data corresponding to the plurality of candidate read voltages;
an ECC suitable for decoding the main coded data to generate main decoded data, and decoding each of the candidate coded data to generate candidate decoded data;
a counter suitable for counting plural quantities of error bits in the main decoded data and the candidate decoded data, wherein each of the plural quantities of error bits is calculated based on a difference between the main coded data and the main decoded data or between the candidate coded data and the candidate decoded data; and
a voltage setting circuit suitable for selecting a read voltage from the main read voltage and the plurality of candidate read voltages and updating the main read voltage with the read voltage, wherein the read voltage selected corresponds to the minimum quantity among the plural quantities of error bits,
wherein the controller is configured to output the main decoded data including a quantity of error bits to an external device when the quantity of error bits is smaller than a predetermined threshold value.

2. The controller of claim 1,
wherein the plural quantities of error bits corresponds to a plurality of bin labels,
wherein the plurality of bin labels indicate locations obtained by dividing the tails of two neighboring threshold voltage distributions based on the plurality of candidate read voltages.

3. The controller of claim 2, wherein each of the plurality of bit labels, corresponding to plural digits included in bin label data stored in the memory, is a value obtained by adding up the plural digits of the bin label data.

4. The controller of claim 3, wherein each digit of the bin label data corresponds to each of the plurality of candidate read voltages, and a threshold voltage higher than each candidate read voltage is represented by '1' and a threshold voltage lower than each candidate read voltage is represented by '0'.

5. The controller of claim 1, wherein the processor controls a memory device to trigger a read reclaim operation based on the quantity of error bits recognized by the main read voltage.

6. The controller of claim 1, wherein the main decoded data is outputted to a host.

7. An operating method of a controller, comprising:
reading target data based on a main read voltage to store main coded data;
decoding the main coded data to generate main decoded data;
counting the quantity of error bits in the main decoded data;
repeatedly reading the target data based on a plurality of candidate read voltages having different levels from the main read voltage to store candidate coded data;
decoding each of the candidate coded data to generate candidate decoded data;
counting each of plural quantities of error bits in each of the candidate decoded data;
selecting a read voltage, corresponding to the minimum quantity of error bits among the plural quantities of error bits, from the main decoded data and the candidate decoded data; and
updating the main read voltage with the read voltage,
wherein the quantity of error bits is calculated based on a difference between the main coded data and the main decoded data or between the candidate coded data and the candidate decoded data, and
wherein the controller outputs the main decoded data including a quantity of error bits to an external device when the quantity of error bits is smaller than a predetermined threshold value.

8. The operating method of claim 7,
wherein the plural quantities of error bits corresponds to a plurality of bin labels,
wherein the plurality of bin labels indicate locations obtained by dividing the tails of two neighboring threshold voltage distributions based on the plurality of candidate read voltages.

9. The operating method of claim 8, further comprising:
storing bin label data, including plural digits individually corresponding to each of the plurality of bit labels, and a value obtained by adding up the plural digits of the bin label data, in a memory.

10. The operating method of claim 9, wherein each digit of the bin label data corresponds to each of the plurality of candidate read voltages, and a threshold voltage higher than each candidate read voltage is represented by '1' and a threshold voltage lower than each candidate read voltage is represented by '0'.

11. The operating method of claim 7, further comprising:
controlling a memory device to trigger a read reclaim operation based on the quantity of error bits recognized by the main read voltage.

12. The operating method of claim 7, further comprising:
outputting the main decoded data to a host.

13. A memory system comprising:
a memory device including a plurality of memory cells for storing data; and
a controller suitable for controlling the memory device,
wherein the controller includes:
a memory suitable for repeatedly reading target data based on a main read voltage and a plurality of candidate read voltages having different levels to obtain main coded data and candidate coded data;
a memory suitable for storing the main coded data corresponding to the main read voltage and the candidate coded data corresponding to the plurality of candidate read voltages;
an ECC suitable for decoding the main coded data to generate main decoded data, and decoding each of the candidate coded data to generate candidate decoded data;
a counter suitable for counting plural quantities of error bits in the main decoded data and the candidate decoded data, wherein each of the plural quantities of error bits is calculated based on a difference between the main coded data and the main decoded data or between the candidate coded data and the candidate decoded data; and a voltage setting circuit suitable for selecting a read voltage from the main read voltage and the plurality of candidate read voltages as a candidate read voltage and updating the main read voltage with the read voltage, wherein the one read voltage selected corresponds to the minimum quantity among the plural quantities of error bits, wherein the controller is configured to output the main decoded data including a quantity of error bits to an external device when the quantity of error bits is smaller than a predetermined threshold value.

14. The memory system of claim 13, wherein the plural quantities of error bits corresponds to a plurality of bin labels, wherein the plurality of bin labels indicate locations obtained by dividing the tails of two neighboring threshold voltage distributions based on the plurality of candidate read voltages.

15. The memory system of claim 14, wherein each of the plurality of bit labels, corresponding to plural digits included in bin label data stored in the memory, is a value obtained by adding up the plural digits of the bin label data.

16. The memory system of claim 15, wherein each digit of the bin label data corresponds to each of the plurality of candidate read voltages, and a threshold voltage higher than each candidate read voltage is represented by '1' and a threshold voltage lower than each candidate read voltage is represented by '0'.

17. The memory system of claim 15, wherein the processor controls the memory device to trigger a read reclaim operation based on the quantity of error bits recognized by the main read voltage.

* * * * *